(12) United States Patent
Lee

(10) Patent No.: US 9,385,312 B2
(45) Date of Patent: Jul. 5, 2016

(54) ELECTRONIC DEVICE AND METHOD FOR FABRICATING THE SAME

(71) Applicant: SK HYNIX INC., Icheon (KR)

(72) Inventor: Jae-Yeon Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 120 days.

(21) Appl. No.: 14/276,837

(22) Filed: May 13, 2014

(65) Prior Publication Data

US 2015/0155482 A1    Jun. 4, 2015

(30) Foreign Application Priority Data

Nov. 29, 2013   (KR) .......................... 10-2013-0147559

(51) Int. Cl.
| | | |
|---|---|---|
| *H01L 45/00* | (2006.01) | |
| *H01L 27/24* | (2006.01) | |
| *G06F 3/06* | (2006.01) | |

(52) U.S. Cl.
CPC .............. *H01L 45/12* (2013.01); *G06F 3/0604* (2013.01); *G06F 3/0659* (2013.01); *G06F 3/0673* (2013.01); *H01L 27/2472* (2013.01); *H01L 27/2481* (2013.01); *H01L 45/08* (2013.01); *H01L 45/1233* (2013.01); *H01L 45/146* (2013.01); *H01L 45/1666* (2013.01)

(58) Field of Classification Search
CPC ..... H01L 45/08; H01L 45/12; H01L 45/1233; H01L 45/146; H01L 45/1666; H01L 27/2463; H01L 27/2472; H01L 27/2481
See application file for complete search history.

(56) References Cited

U.S. PATENT DOCUMENTS

| | | | |
|---|---|---|---|
| 6,531,371 B2 | 3/2003 | Hsu et al. | |
| 8,106,376 B2 * | 1/2012 | Lai | H01L 45/06 257/2 |
| 8,222,626 B2 * | 7/2012 | Sato | G11C 29/832 257/2 |
| 2013/0015421 A1 * | 1/2013 | Sim | H01L 45/06 257/2 |
| 2013/0221309 A1 * | 8/2013 | Lee | H01L 45/085 257/2 |
| 2014/0319442 A1 * | 10/2014 | Hayashi | H01L 45/12 257/2 |
| 2015/0179704 A1 * | 6/2015 | Yoshida | H01L 27/249 257/5 |
| 2015/0214478 A1 * | 7/2015 | Lee | H01L 45/1233 257/5 |
| 2015/0372056 A1 * | 12/2015 | Seong | H01L 45/141 257/4 |

* cited by examiner

*Primary Examiner* — Allison P Bernstein

(57) ABSTRACT

An electronic device includes a semiconductor memory. The semiconductor memory includes a plurality of first planes and a plurality of second planes which are disposed over a substrate and alternately stacked in a vertical direction over the substrate, where each of the first planes includes a plurality of first lines which extends in a first direction parallel to the substrate and each of the second planes includes a plurality of second lines which extends in a second direction parallel to the substrate and intersecting with the first direction, a plurality of variable resistance patterns which is interposed between each of the first planes and each of the second planes, each of the variable resistance patterns being disposed at a cross point between a first line and a corresponding second lines, and an air-gap which is disposed between neighboring variable resistance patterns.

17 Claims, 13 Drawing Sheets

ELECTRONIC DEVICE AND METHOD FOR FABRICATING THE SAME

CROSS-REFERENCE TO RELATED APPLICATION

The present application claims priority to Korean Patent Application No. 10-2013-0147559, entitled "ELECTRONIC DEVICE AND METHOD FOR FABRICATING THE SAME" and filed on Nov. 29, 2013, which is incorporated by reference herein in its entirety.

TECHNICAL FIELD

Embodiments of the present disclosure relate to memory circuits or devices and their applications in electronic devices or systems.

BACKGROUND

As electronic devices become smaller with low power consumption, high performance, and multi-functionality, semiconductor memory devices capable of storing information in these electronic devices (e.g., computers, portable communication devices, or the like) are increasingly in demand. Such semiconductor memory devices may use a resistance variable element that switches between different resistance states according to a voltage or current applied to such an element. Semiconductor memory devices include, for example, resistive random access memory (RRAM) devices, phase change random access memory (PRAM) devices, ferroelectric random access memory (FRAM) devices, magneto-resistive random access memory (MRAM) devices, E-fuses, or the like.

SUMMARY

Embodiments of the present disclosure relate to memory circuits, devices, and their applications in electronic devices or systems.

Various embodiments are directed to an electronic device in which the degree of integration is increased, the level of difficulty in a fabrication process is decreased, and a data storage characteristic is improved. Embodiments also relate to a method for fabricating the electronic device.

In an embodiment, an electronic device includes a semiconductor memory unit that includes: one or more first planes and one or more second planes which are disposed over a substrate and alternately stacked in a vertical direction to the substrate, where each of the first planes includes a plurality of first lines which are extended in a first direction parallel to the substrate and each of the second planes includes a plurality of second lines which are extended in a second direction parallel to the substrate and intersecting with the first direction; a plurality of variable resistance patterns which are interposed between the first planes and the second planes and have shapes of islands at cross points between the first lines and the second lines; and an air-gap which is disposed between the variable resistance patterns which are at same heights in the vertical direction.

Embodiments of the above device may include one or more of the following.

The air-gap is extended in the vertical direction to pass through the first and second planes in a region not overlapping with the first lines and the second lines. The electronic device further comprises an insulating pattern surrounding sidewalls of the variable resistance patterns. The insulating pattern has a mesh-like shape and surrounds the air-gap. The insulating pattern includes a plurality of insulating patterns which have shapes of islands, wherein each of the plurality of insulating patterns surrounds a sidewall of each of the variable resistance patterns, and the air-gap has a mesh-like shape and surrounds sidewalls of the plurality of insulating patterns. The air-gap has a mesh-like shape and surrounds sidewalls of the variable resistance patterns. The variable resistance patterns include an oxygen-deficient metal oxide containing oxygen vacancies, and the insulating pattern includes an oxygen-rich metal oxide containing more oxygen than the oxygen-deficient metal oxide. The oxygen-rich metal oxide satisfies a stoichiometric ratio. The variable resistance patterns have a tetragon-like shape whose diagonal direction substantially coincides with the first direction and the second direction. The electronic device further comprises first spacers which are formed on both sidewalls of each of the first lines; and second spacers which are formed on both sidewalls of each of the second lines, wherein the air-gap is disposed between the first spacers and between the second spacers. The electronic device further comprises a first insulating layer which is buried between the first spacers; and a second insulating layer which is buried between the second spacers, wherein the air-gap passes through the first and second insulating layers. The first and second spacers are formed of a material having an etch selectivity against the first and second insulating layers and the variable resistance patterns. The electronic device further comprises a first insulating layer which is buried between the first lines; and a second insulating layer which is buried between the second lines, wherein the air-gap passes through the first and second insulating layers.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

In an embodiment, a method for fabricating an electronic device includes a semiconductor memory unit that includes: forming a forming a plurality of first lines which are extended in a first direction parallel to a substrate over the substrate, and a first insulating layer which is buried between the first lines; forming a variable resistance layer over the first lines and the first insulating layer; forming a plurality of second lines which are extended in a second direction parallel to the substrate and intersecting with the first direction over the variable resistance layer, and a second insulating layer which is buried between the second lines; and forming a hole which is extended in a vertical direction to the substrate by etching the first insulting layer, the variable resistance layer and the second insulating layer in a region not overlapping with the first lines and the second lines.

Embodiments of the above method may include one or more the following.

The method further comprises forming a plurality of variable resistance patterns having shapes of islands at cross points between the first lines and the second lines by etching a portion of a sidewall of the variable resistance layer exposed due to the hole or transforming the same into an insulating pattern. The variable resistance layer includes an oxygen-deficient metal oxide containing oxygen vacancies and the insulating pattern is formed by performing an oxidation process on a portion of the sidewall of the variable resistance layer. The forming of the hole is performed through an etch process using a mask or through a self-aligned etch process. The method further comprises forming first spacers on both sidewalls of each of the first lines; and forming second spacers on both sidewalls of each of the second lines, wherein each of the first and second spacers functions as an etch barrier, in the forming of the hole. The variable resistance layer is separated into a plurality of variable resistance patterns having shapes of islands at cross points between the first lines and the second lines by an isotropic etch process, in the forming of the hole. The method further comprises transforming a portion of a sidewall of each of the variable resistance patterns exposed by the hole into an insulating pattern after the forming of the hole. The variable resistance pattern includes an oxygen-deficient metal oxide containing oxygen vacancies the insulating pattern is formed by performing an oxidation process on a portion of the sidewall of the variable resistance layer.

These and other aspects, implementations and associated advantages are described will become apparent in view of the drawings and the description of embodiments provided herein, which are intended to provide further explanation of the invention as claimed.

DETAILED DESCRIPTION

Figure 1:
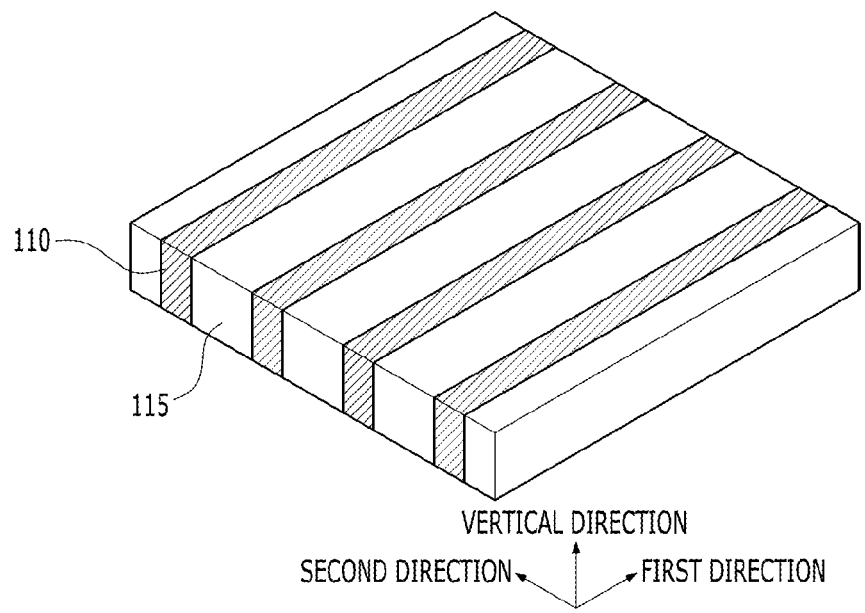
FIG. 1 illustrates a process of forming a plurality of first lines and a plurality of first insulating layers in accordance with an embodiment.

Various embodiments of the present disclosure will be described below with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers exist between the first layer and the second layer or the substrate.

FIGS. 1 to 6 illustrate a semiconductor device and a method for fabricating the same in accordance with an embodiment of the present disclosure.

The method of fabricating the semiconductor device will be described hereafter.

Referring to FIG. 1, a plurality of first lines 110 are formed to extend in a first horizontal direction (hereinafter, referred to as a 'first direction') over a substrate (not shown) such that two neighboring first lines 110 are spaced apart from each other by a predetermined distance in a second horizontal direction (hereinafter, referred to as a 'second direction'). The second direction intersects with the first direction. In an embodiment, the second direction is perpendicular to the first direction. A first insulating layer 115 is formed between the neighboring first lines 110 to isolate the neighboring first lines 110 from each other.

In an embodiment, the first lines 110 are formed by depositing a conductive material over the substrate and patterning the deposited conductive material to have a line-type pattern. Subsequently, the first insulating layer 115 is formed by depositing an insulating material to cover substantially the entire surface of the substrate including the first lines 110. Then, a planarization process, e.g., Chemical Mechanical Polishing (CMP) process, is performed on the deposited insulating material until top surfaces of the first lines 110 are exposed.

In another embodiment, an insulating material is deposited over the substrate and patterned to form a plurality of the first insulating layers 115, each of which is spaced apart from a neighboring first insulating layer 115 by a preset distance. Subsequently, the first lines 110 are formed by depositing a conductive material over substantially the entire surface of the substrate including the first insulating layers 115 to fill each space defined by two neighboring first insulating layers 115. Then, a planarization process is performed on the deposited conductive material until top surfaces of the first insulating layers 115 are exposed.

The first lines 110 may be formed of one or more conductive material, e.g., a metal, a metal nitride, a polysilicon material doped with an impurity, or a combination thereof. The first insulating layer 115 may be formed of one or more of various insulating materials, e.g., an oxide layer.

Figure 2:
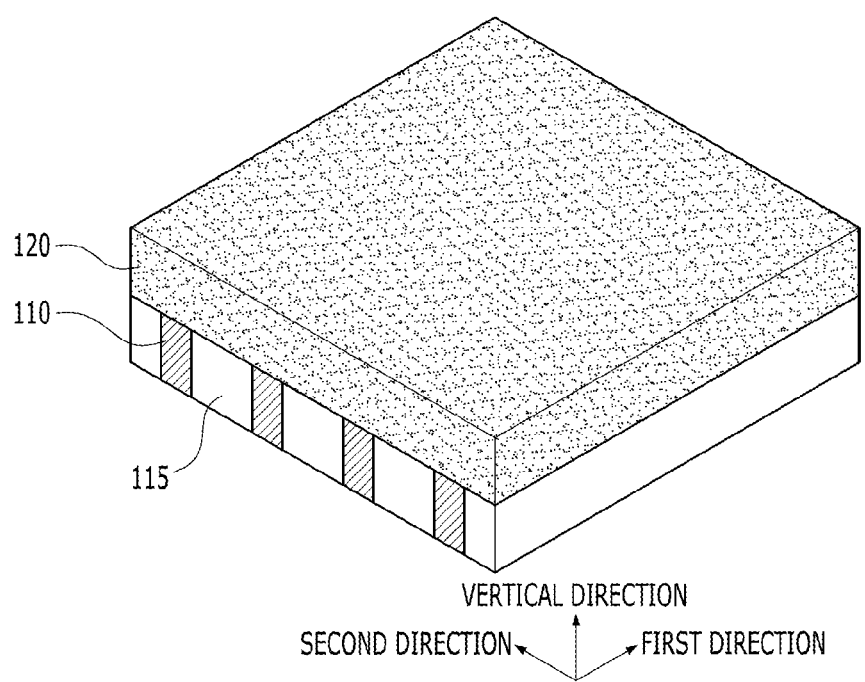
FIG. 2 illustrates a process of forming a variable resistance layer in accordance with an embodiment.

Referring to FIG. 2, a variable resistance layer 120 is formed over the first lines 110 and the first insulating layers 115.

The variable resistance layer 120 is formed of a variable resistance material that switches between different resistance states depending on a voltage or current applied thereto. In an embodiment, the variable resistance layer 120 includes a single layer or a plurality of layers. The variable resistance material may include a metal oxide (e.g., a transition metal oxide), a perovskite-based material, a phase change material (e.g., a chalcogenide-based material), a ferroelectric material, a ferromagnetic material, or the like. Particularly, when the variable resistance layer 120 is formed of a metal oxide, the variable resistance layer 120 includes an oxygen-deficient metal oxide material, which is deficient in oxygen compared to a material that satisfies a stoichiometric ratio. The oxygen-deficient metal oxide material may include $TiO_x$, where x is smaller than 2, or $TaO_y$, where y is smaller than 2.5. Since the variable resistance layer 120 is formed of the oxygen-deficient metal oxide material, the variable resistance layer 120 includes oxygen vacancies. As a result, depending on a voltage or a current applied to the variable resistance layer 120, a plurality of current paths (or filaments) may be formed or disappear in the variable resistance layer 120 and accordingly a resistance state of the variable resistance layer 120 changes.

Figure 3:
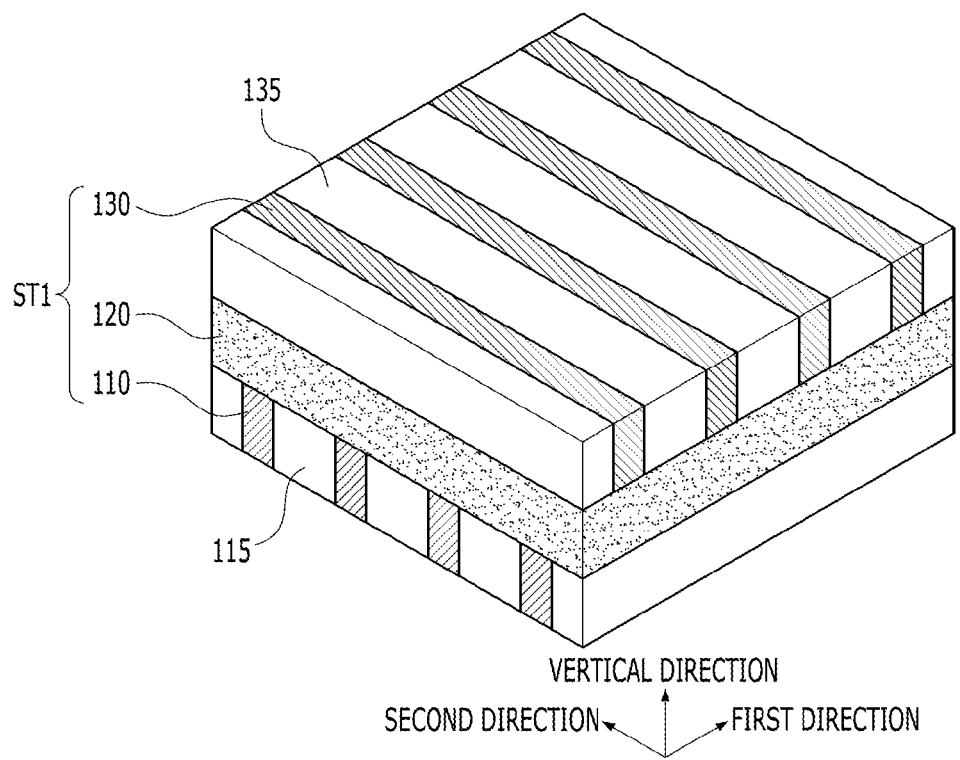
FIG. 3 illustrates a process of forming a plurality of second lines and a plurality of second insulating layers in accordance with an embodiment.

Referring to FIG. 3, a plurality of second lines 130 is formed to extend in the second direction over the variable resistance layer 120 such that two neighboring second lines 130 are spaced apart from each other by a predetermined distance along the first direction. A second insulating layer 135 is formed to fill the space between the two neighboring second lines 130. The second lines 130 and the second insulating layers 135 may be formed using substantially the same processes as those of forming the first lines 110 and the first insulating layers 115, as described above with reference to FIG. 1.

In an embodiment, a first stacked structure ST1 includes the plurality of first lines 110 extending in the first direction, the variable resistance layer 120 disposed over the first lines 110, and the plurality of second lines 130 extending in the second direction and disposed over the variable resistance layer 120. In the first stacked structure ST1, a first line 110 and a second line 130 apply a voltage across or a current through the variable resistance layer 120 interposed between the first lines 110 and the second lines 130, thereby changing a resistance state of an intersecting portion of the variable resistance layer 120 disposed at a cross point of the first line 110 and the second lines 130. Thus, data corresponding to the resistance state of the intersecting portion of the variable resistance layer 120 is stored in a corresponding memory cell. A memory cell may be formed at each of cross points of the first lines 110 and the second lines 130 to store data in a portion of the variable resistance layer 120.

A stacked structure such as the first stacked structure ST1 may include a plurality of layers that are vertically stacked over the substrate. In an embodiment, two adjacent structures (e.g., ST1 and ST2 shown in FIG. 4A) stacked in a vertical direction share a plurality of lines (e.g., the second lines 130).

Figure 4A:
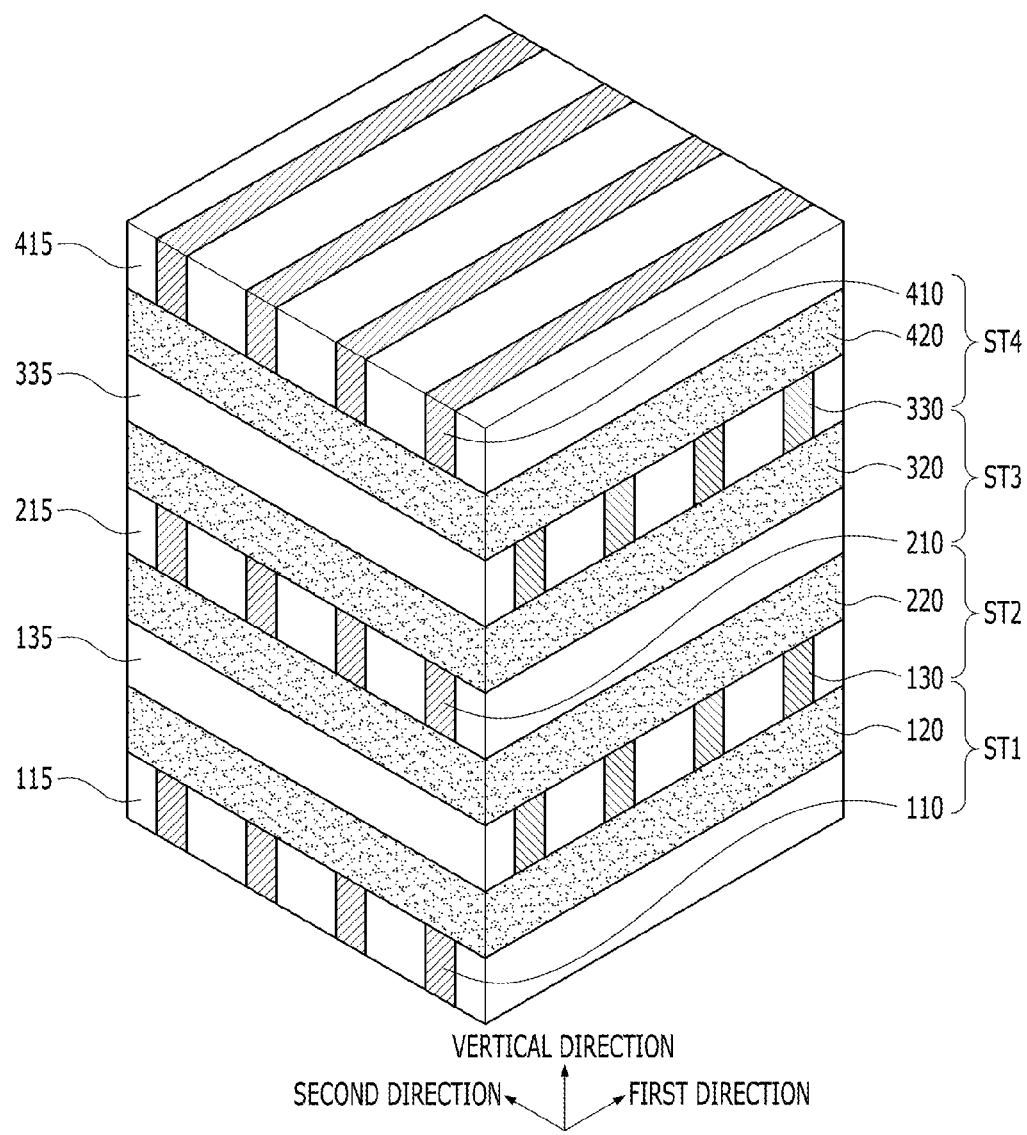
FIGS. 4A and 4B are a perspective view and a plan view illustrating a plurality of stacked structures in accordance with an embodiment, respectively.

Referring to FIG. 4A, another variable resistance layer, e.g., a second variable resistance layer 220, is formed over a resultant structure of FIG. 3, i.e., the first stacked structure ST1, using substantially the same processes as those of forming the variable resistance layer 120 described with reference to FIG. 2. Subsequently, a second plurality of first lines 210 is formed using substantially the same processes as those of forming the first plurality of first lines 110 described with reference to FIG. 1, thereby forming the second stacked structure ST2, which includes the plurality of second lines 130, the second variable resistance layer 220, and the second plurality of first lines 210. The above-described processes may be repeatedly performed to further form a plurality of stacked structures, e.g., ST3 and ST4, over the second stacked structure ST2 as shown in FIGS. 4A and 4B.

Figure 4B:
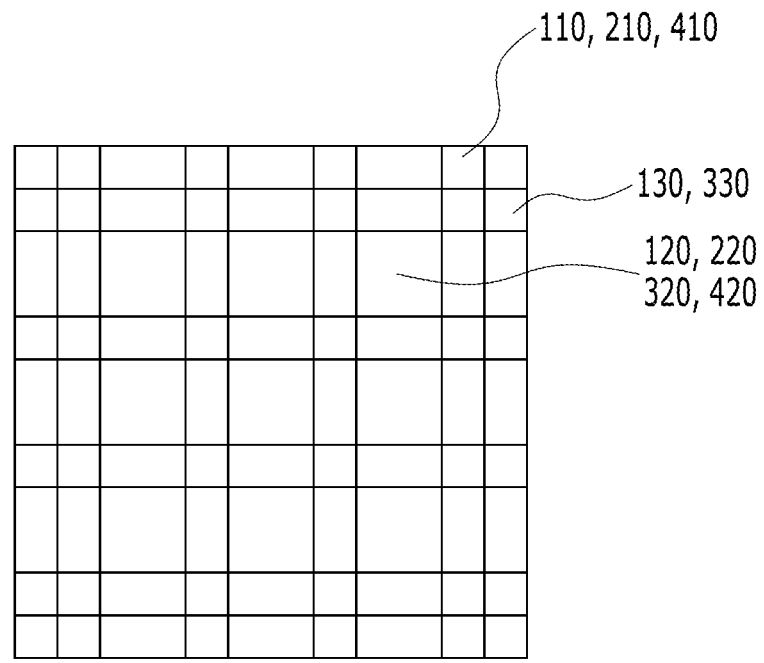

In particular, referring to FIGS. 4A and 4B, the second variable resistance layer 220, the second plurality of first lines 210 and a second plurality of first insulating layers 215, a third variable resistance layer 320, a second plurality of second lines 330 and a second plurality of second insulating layers 335, a fourth variable resistance layer 420, and a third plurality of first lines 410 and a third plurality of first insulating layers 415 are sequentially formed over the resultant structure, which includes the first plurality of first lines 110 and the first plurality of first insulating layers 115, the first variable resistance layer 120, and the first plurality of second lines 130 and the first plurality of second insulating layers 135, as shown in FIG. 3. For convenience of description, when a structure including a plurality of lines and a plurality of insulating layers disposed at substantially the same level in a vertical direction is referred to as being disposed on the same a plane or in the same layer, such that a first plane includes the first lines 110 and the first insulating layers 115 and a second plane includes the second lines 130 and the second insulating layers 135. The first and second planes may be alternately stacked over the substrate with a variable resistance layer that is interposed between the first plane and the second plane in the vertical direction.

The second stacked structure ST2 that includes the first plurality of second lines 130 at the lowermost layer shares the first plurality of second lines 130 with the first stacked structure ST1 that includes the plurality of second lines 130 at the uppermost layer. The second stacked structure ST2 includes the second plurality of first lines 210 extending in the first direction, the first plurality of second lines 130 extending in the second direction, and the second variable resistance layer 220 interposed between the second lines 130 and the first lines 210. In an embodiment, the second variable resistance layer 220 has the shape of a plate. Similarly, the third stacked structure ST3 includes the second plurality of first lines 210, the second plurality of second lines 330 over the first lines 210, and the third variable resistance layer 320 interposed between the first lines 210 and the second lines 330. The fourth stacked structure ST4 includes the second plurality of second lines 330, the third plurality of first lines 410 over the second lines 330, and the fourth variable resistance layer 420 interposed between the second lines 330 and the first lines 410. Although first to fourth stacked structures ST1, ST2, ST3, and ST4 are illustrated in the embodiment shown in FIG. 4A, it would be obvious to those skilled in the art that five or more stacked structures may be formed over the substrate. In the embodiment shown in FIG. 4A, the first to third pluralities of first lines 110, 210, and 410 have substantially the same configuration such that vertically corresponding first lines 110, 210, and 410, substantially overlap with each other when viewed from the top as indicated in FIG. 4B. In other words, in an embodiment, first lines 110, 210, and 410 are vertically aligned. The first to second pluralities of second lines 130 and 330 also have substantially the same configuration. In an embodiment, each of the first lines 110, 210, and 410 may function as one of a bit line and a word line and each of the second lines 130 and 330 may function as the other of the bit line and the word line.

The first to fourth variable resistance layers 120, 220, 320, and 420 included respectively in the first to fourth stacked structures ST1, ST2, ST3, and ST4 have the plate shape. In addition, a plurality of memory cells formed in the first stacked structure ST1 is coupled with each other through the first lines 110 and the second lines 130. Therefore, a disturbance may occur between the memory cells. The disturbance may also occur among the first to fourth stacked structures ST1, ST2, ST3 and ST4. In order to address issues related to a disturbance that may occur between the memory cells, the variable resistance layer 120 may be patterned into a plurality of variable resistance patterns, each of which has an island shape at the cross points between the first lines 110 and the second lines 130. As a result, the plurality of variable resistance patterns of the variable resistance layer 120 is electrically isolated from each other to substantially prevent the disturbance from occurring between the memory cells. In an embodiment, such an island-shaped variable resistance pattern is formed using processes described with reference to FIGS. 5A to 5C and FIG. 6.

Figure 5A:
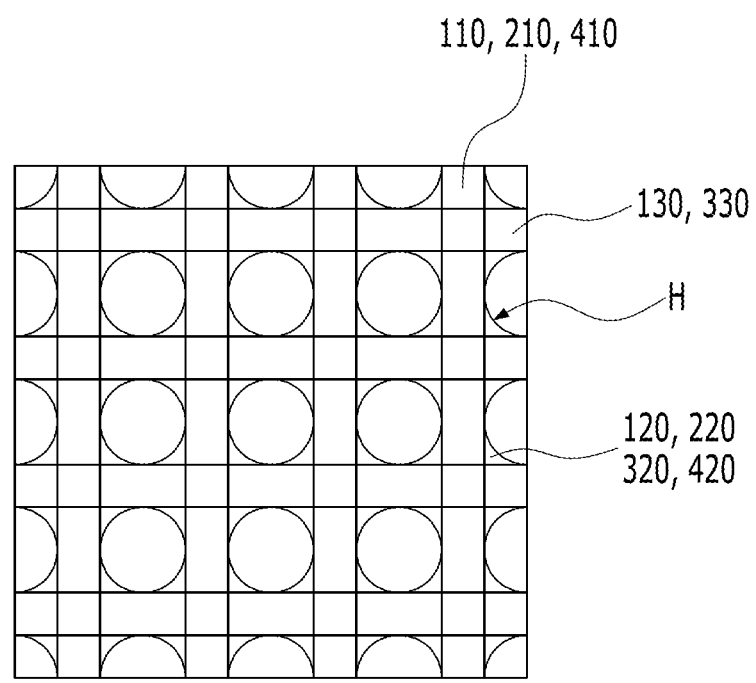
FIGS. 5A to 5C illustrate a process of forming a plurality of holes in the plurality of stacked structures shown in FIG. 4A, in accordance with an embodiment.
Figure 5B:
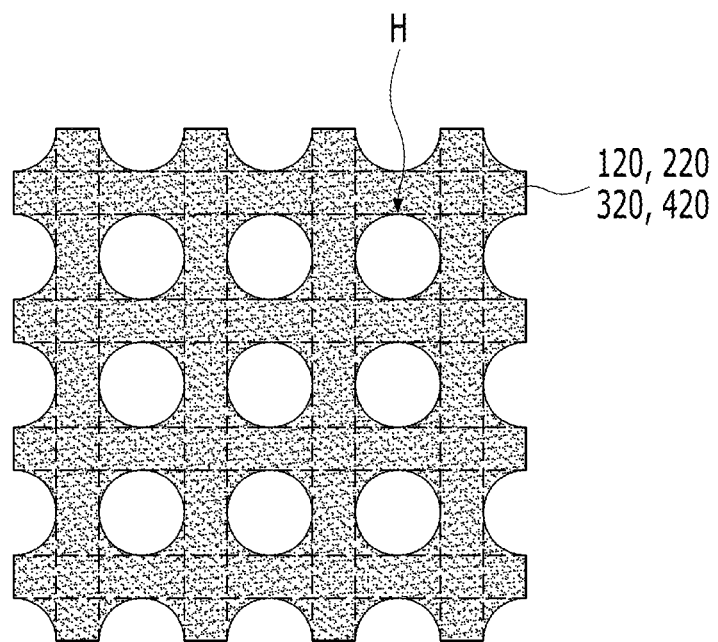
Figure 5C:
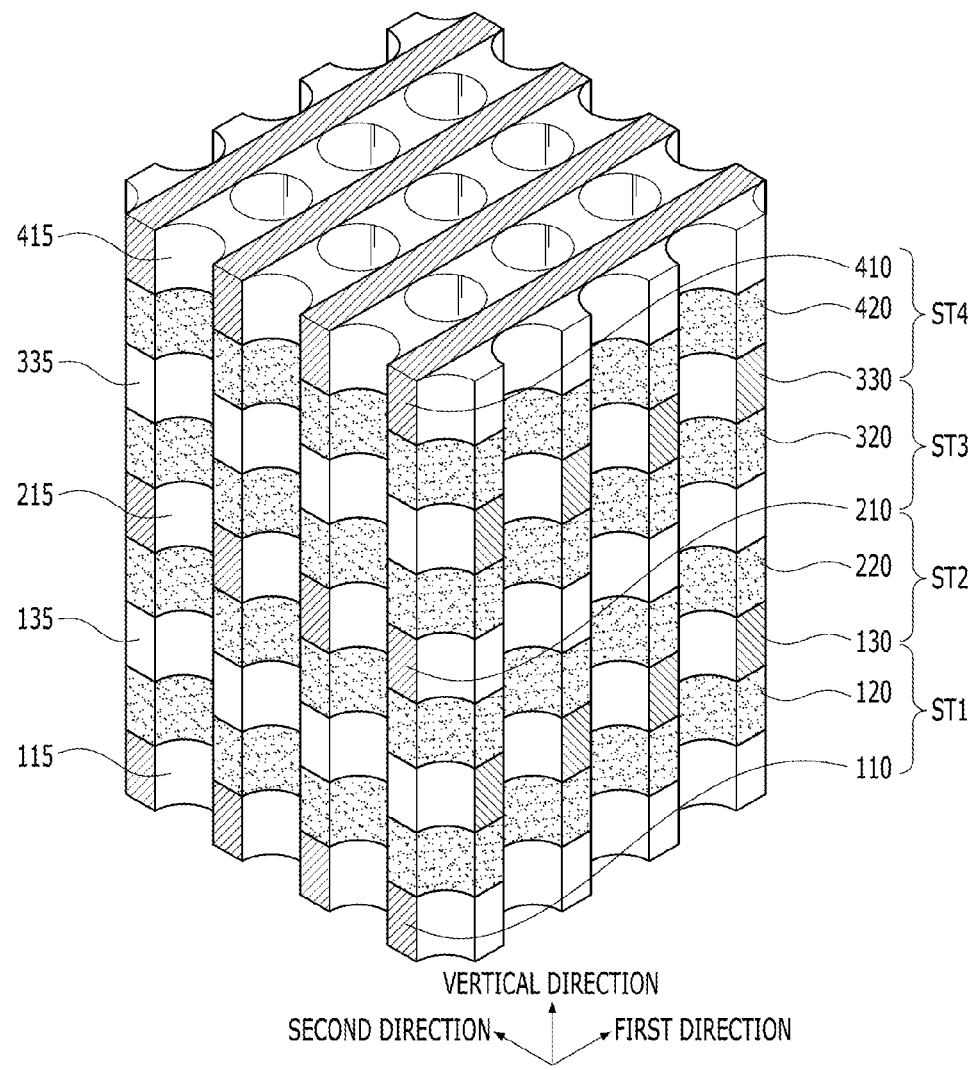

Referring to FIGS. 5A to 5C, a plurality of holes H is formed to penetrate the first to fourth stacked structures ST1 to ST4 in the vertical direction. The holes H are formed in regions enclosed by two neighboring lines of each plurality of first lines 110, 210, and 410 and two neighboring lines of each plurality of second lines 130 and 330. The holes H may be formed by etching in those regions through the first to fourth stacked structures ST1 to ST4.

The holes H may be formed by mask and etch processes. During the processes, a mask is disposed to expose the regions where the holes are to be formed and is used as an etch barrier. In another embodiment, the holes H are formed through a self-aligned etch process using the first lines 110, 210, and 410 and the second lines 130 and 330 as etch barriers without using a separate mask. The etch process of forming the holes H may be an isotropic etch process or an anisotropic etch process. A plan view of the variable resistance layers 120, 220, 320, and 420, after the holes H have been formed, is illustrated in FIG. 5B.

Figure 6:
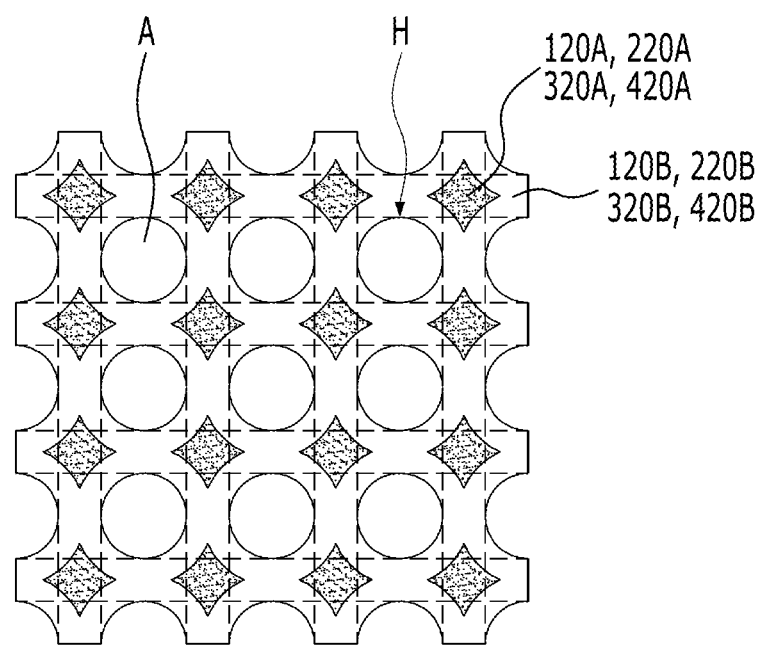
FIG. 6 illustrates a process of forming a plurality of island-shaped patterns in accordance with an embodiment.

In an embodiment of the present disclosure, the holes H are formed using an anisotropic etch process, or a relatively weak anisotropic etch process. As shown in FIGS. 5B and 5C, although the holes H have been formed, the variable resistance layers 120, 220, 320, and 420 remain to overlap with the first lines 110, 210, and 410 and the second lines 130 and 330. In other words, portions of the variable resistance layers 120, 220, 320, and 420, which are disposed at the cross points of the first lines 110, 210, and 410 and the second lines 130 and 330, remain, and have not been completely separated from each other by the holes. In order to form a plurality of island-shaped patterns separated from each other, a process shown in FIG. 6 may be performed on the resultant structure of FIGS. 5B and 5C. FIG. 6, like FIG. 5B, shows a plan view of each of the variable resistance layers 120, 220, 320, and 420.

Referring to FIG. 6, as a result of performing a specific process on the variable resistance layers 120, 220, 320 and 420 that are partially exposed by the holes H, exposed portions, e.g., sidewall portions, of the variable resistance layers 120, 220, 320, and 420, which are adjacent to the holes H, are transformed into insulating patterns 120B, 220B, 320B, and 420B. The remaining portions of the variable resistance layers 120, 220, 320, and 420, which are not transformed by the specific process, will be hereafter referred to as variable resistance patterns 120A, 220A, 320A, and 420A. That is, after the specific process is performed, the variable resistance layers 120, 220, 320, and 420, through which the holes H are formed, include untransformed portions, i.e., the variable resistance patterns 120A, 220A, 320A, and 420A, and transformed portions, i.e., the insulating patterns 120B, 220B, 320B, and 420B, respectively.

In an embodiment, when the variable resistance layers 120, 220, 320, and 420 include an oxygen-deficient metal oxide, the variable resistance layers 120, 220, 320, and 420 exposed by the holes H may be transformed into an oxygen-rich metal oxide, which includes a metal oxide that satisfies the stoichiometric ratio (e.g., $TiO_2$, $Ta_2O_5$, or the like). In order to transform the exposed portions of the variable resistance layers 120, 220, 320, and 420 into the insulating patterns 120B, 220B, 320B, and 420B including the oxygen-rich metal oxide, the specific process includes an oxidation process, which is performed on the resultant structure shown in FIGS. 5A to 5C. As a result, the variable resistance patterns 120A, 220A, 320A, and 420A are formed to include the oxygen-deficient metal oxide, and the insulating patterns 120B, 220B, 320B, and 420B are formed to include the oxygen-rich metal oxide. Since the oxygen-rich metal oxide satisfies the stoichiometric ratio, the density of oxygen vacancies in the oxygen-rich metal oxide may be insufficient to cause a resistance state change, which results from the migration of oxygen vacancies in the variable resistance layers 120, 220, 320, and 420. That is, the oxygen-rich metal oxide becomes an electrically insulating material.

The specific process of forming the insulating patterns 120B, 220B, 320B, and 420B (e.g., the oxidation process) is performed until the variable resistance patterns 120A, 220A, 320A, and 420A are separated from each other. As a result, the variable resistance patterns 120A, 220A, 320A, and 420A are disposed in an island shape at the cross points between the first lines 110, 210, and 410 and the second lines 130 and 330.

In an embodiment, since the oxidation process is substantially isotropic, each of the variable resistance patterns 120A, 220A, 320A, and 420A has a tetragon-like shape enclosed by four curved lines such that two diagonals for each variable resistance pattern are substantially disposed in the first direction and the second direction, respectively, as shown in FIG. 5C. Each of the insulating patterns 120B, 220B, 320B, and 420B includes a mesh-like structure, which has interconnected cross-members defining the holes H disposed at substantially the same level in a vertical direction. Each of the variable resistance patterns 120A, 220A, 320A, and 420A is disposed in an intersecting region of the interconnected cross-members. The variable resistance patterns disposed at substantially the same level in the vertical direction are arranged in a matrix form along the first and second direction.

In an embodiment, since the holes H are filled with air or in a vacuum, a space in the hole H will be referred to as an air-gap A. Accordingly, the variable resistance patterns disposed at substantially the same level in the vertical direction, e.g., the variable resistance patterns 120A included in the first stacked structure ST1, are insulated from each other by the insulating patterns 120B and the air-gaps A. Furthermore, since the air-gaps A extend in the vertical direction, the air-gaps A exist between one plurality of lines disposed at a first level and the other plurality of lines disposed at a second level different from the first level, e.g., the first plurality of first lines 110 and the first plurality of second lines 130 included in the first stacked structure ST1.

As described above, in an embodiment, some portions of the variable resistance layers 120, 220, 320, and 420, the first insulating layers 115, 215, and 415, and the second insulating layers 135 and 335 in the stacked structures shown in FIGS. 4A and 4B are changed to corresponding portions of the stacked structures shown in FIGS. 5A to 5C and FIG. 6 using the aforementioned processes.

As illustrated in FIG. 5C, a semiconductor device in accordance with an embodiment of the present disclosure includes one or more stacked structures, e.g., the first to fourth stacked structures ST1, ST2, ST3, and ST4, each of which has a plurality of layers that are vertically stacked over the substrate. The first to fourth stacked structures ST1, ST2, ST3, and ST4 include the first to third pluralities of first lines 110, 210, and 410, and the first and second pluralities of second lines 130 and 330, where each of the different pluralities of lines is disposed at substantially the same level in the vertical direction. The first to fourth stacked structures ST1, ST2, ST3, and ST4 also include the first to fourth variable resistance patterns 120A, 220A, 320A, and 420A, which have an island shape and are disposed at the cross points between the first lines 110, 210, and 410 and the second lines 130 and 330. Two adjacent structures stacked in the vertical direction (e.g., the first and second stacked structures ST1 and ST2) share a layer including a plurality of lines at substantially the same level (e.g., the first plurality of second lines 130) with each other.

The insulating patterns 120B, 220B, 320B, and 420B and the air-gaps A surrounding each of the variable resistance patterns 120A, 220A, 320A, and 420A exist at substantially the same level in the vertical direction as that of the variable resistance patterns 120A, 220A, 320A, and 420A, respectively. Since the air-gaps A are formed to have a column shape extending in the vertical direction by selectively etching the first and second insulating layers 115, 135, 215, 335, and 415, the air-gaps A exist in the first and second insulating layers 115, 135, 215, 335, and 415.

In a conventional semiconductor device, each of variable resistance layers is patterned into a plurality of variable resistance patterns having an island shape whenever each stacked structure is formed to substantially prevent a disturbance from occurring between memory cells. Accordingly, in a conventional semiconductor device including four stacked structures, four etching processes are necessary to form island-shaped variable resistance patterns. In contrast, in a semiconductor device including the four stacked structures ST1 to ST4 according to an embodiment, after the variable resistance layers 120, 220, 320, and 420 have been formed, an etch process is performed on the variable resistance layers 120, 220, 320, and 420 to form the vertical holes H, which penetrate through the variable resistance layers 120, 220, 320, and 420. Therefore, a manufacturing process may be simplified, and thus the process cost may be reduced.

In the conventional semiconductor device, since variable resistance layers are separately patterned, there may be issues related to alignment. In contrast, in a semiconductor device according to an embodiment, since the variable resistance layers 120, 220, 320, and 420 are patterned simultaneously when forming the vertical holes H, such alignment related issues may be avoided.

In an embodiment, sidewall portions of the variable resistance layers 120, 220, 320 and 420 exposed by the holes H are transformed (e.g., oxidized) into the insulating patterns 120B, 220B, 320B, and 420B to separate the variable resistance patterns 120A, 220A, 320A, and 420A from each other. As a result, a disturbance that may occur between memory cells may be reduced in the first to fourth stacked structures ST1, ST2, ST3, and ST4. Furthermore, in this embodiment, since parts damaged by etching the variable resistance layers 120, 220, 320, and 420 to form the vertical holes H are transformed into the insulating patterns 120B, 220B, 320B, and 420B, the variable resistance patterns 120A, 220A, 320A, and 420A may be less affected by damage resulting from the etching process. As a result, characteristics of the memory cells may be secured, and data storage characteristics of the semiconductor device may be improved.

In an embodiment, the insulating patterns 120B, 220B, 320B, and 420B and the air-gaps A exist between the variable resistance patterns 120A, 220A, 320A, and 420A. Due to the existence of the air-gaps A, a dielectric constant between the variable resistance patterns 120A, 220A, 320A, and 420A may be significantly increased.

Moreover, since, in a semiconductor device according to an embodiment, processing issues and deterioration of the data storage characteristics may be addressed as described above, it is easier to increase the number of the stacked structures. As a result, the degree of integration of the semiconductor device may be increased.

The above-described processes and devices according to embodiments of the present disclosure may be modified in various ways.

Figure 7A:
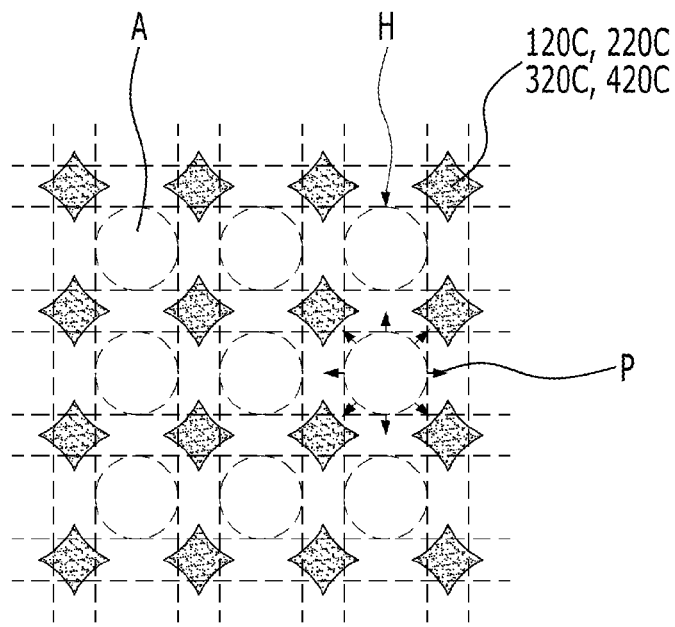
FIG. 7A illustrates a variable resistance layer having a plate shape in accordance with an embodiment of the present disclosure.

In an embodiment, when forming a plurality of holes in the resultant structure shown in FIGS. 4A and 4B, an isotropic etch process is performed so that variable resistance patterns 120C, 220C, 320C, and 420C are formed as illustrated in FIG. 7A.

FIG. 7A illustrates a plan view of a variable resistance layer in accordance with an embodiment of the present disclosure.

Referring to FIG. 7A, when holes H are formed by an isotropic etch process in the variable resistance layers 120, 220, 320, and 420, the holes H have a curved vertical sidewall such that a cross-sectional area P of the holes H is greater than that of an opening (indicated as dotted circles) of etch masks defining the holes H. As a result, the variable resistance layers 120, 220, 320, and 420 may be changed to variable resistance patterns 120C, 220C, 320C, and 420C having an island shape, without performing an additional process such as the oxidation process performed to form the insulation patterns 120B, 220B, 320B, and 420B after the formation of holes, as described with reference to FIG. 6.

Thus, manufacturing process of a semiconductor device in accordance with an embodiment of the present disclosure may become simplified. Since air-gap A exists between neighboring variable resistance patterns 120C, 220C, 320C, and 420C, the insulation between the neighboring variable resistance patterns 120C, 220C, 320C, and 420C may be significantly increased.

Some portions of the sidewalls of the variable resistance patterns 120C, 220C, 320C, and 420C may be damaged by the etch process, so that data storage characteristics of the variable resistance patterns 120C, 220C, 320C, and 420C may be deteriorated. Therefore, in order to address this issue, a process similar to the process shown in FIG. 6, e.g., an oxidation process, may be further performed on the variable resistance patterns 120C, 220C, 320C, and 420C. A plan view of the resultant structure of such a process is illustrated in FIG. 7B.

Figure 7B:
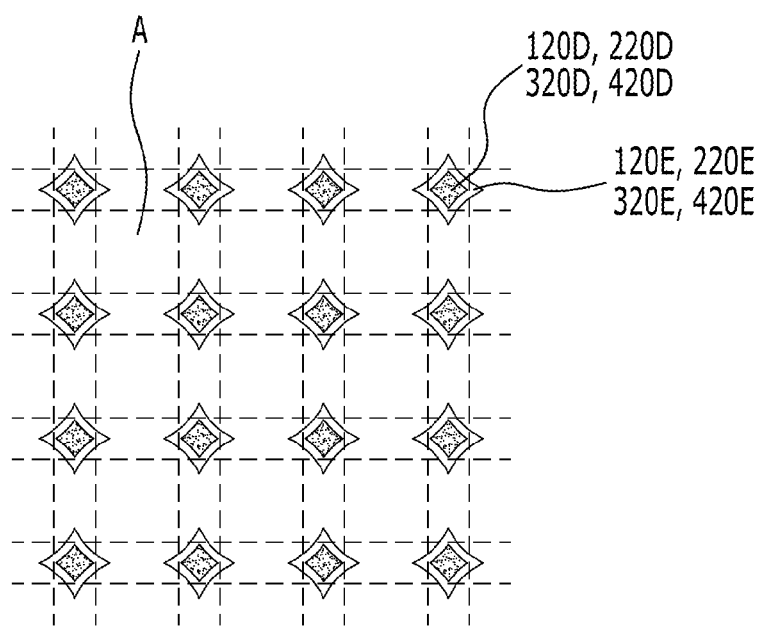
FIG. 7B illustrates a variable resistance layer having a plate shape in accordance with another embodiment of the present disclosure.

Referring to FIG. 7B, portions of the sidewalls (hereinafter, referred to as 'sidewall portions') of the variable resistance patterns 120C, 220C, 320C, and 420C are transformed into insulating patterns 120E, 220E, 320E, and 420E, respectively. The untransformed portions of the variable resistance patterns 120C, 220C, 320C, and 420C are represented by reference numerals 120D, 220D, 320D, and 420D, respectively.

Each of the insulating patterns 120E, 220E, 320E, and 420E has an island shape, surrounding each of the variable resistance patterns 120D, 220D, 320D, and 420D. As shown in FIG. 7B, the air-gap A has a mesh-like shape and is formed to surround the insulating patterns 120E, 220E, 320E, and 420E.

In an embodiment, the variable resistance patterns 120C, 220C, 320C, and 420C shown in FIG. 7A may be formed by further performing an isotropic etch process on the resultant structure of FIGS. 5A to 5C before performing an oxidation process. After that, as described with reference to FIG. 7B, an additional process (e.g., the oxidation process) is performed on the variable resistance patterns 120C, 220C, 320C, and 420C so that the variable resistance patterns 120D, 220D, 320D, and 420D which are surrounded by the insulating patterns 120E, 220E, 320E, and 420E are obtained.

In an embodiment, during the above-described isotropic etch process of etching the variable resistance layers 120, 220, 320 and 420, the first and second insulating layers 115, 135, 215, 335, and 415 (see FIG. 4A) are also etched to substantially the same extent as the variable resistance layers 120, 220, 320 and 420. In another embodiment, the first and second insulating layers 115, 135, 215, 335, and 415 are formed of a material that is hardly etched, and thus less etched than the variable resistance layers 120, 220, 320, and 420.

In the embodiment described above, the holes H are formed in the etch process using a mask. In another embodiment, the holes H are formed by a self-aligned etch process.

Figure 8:
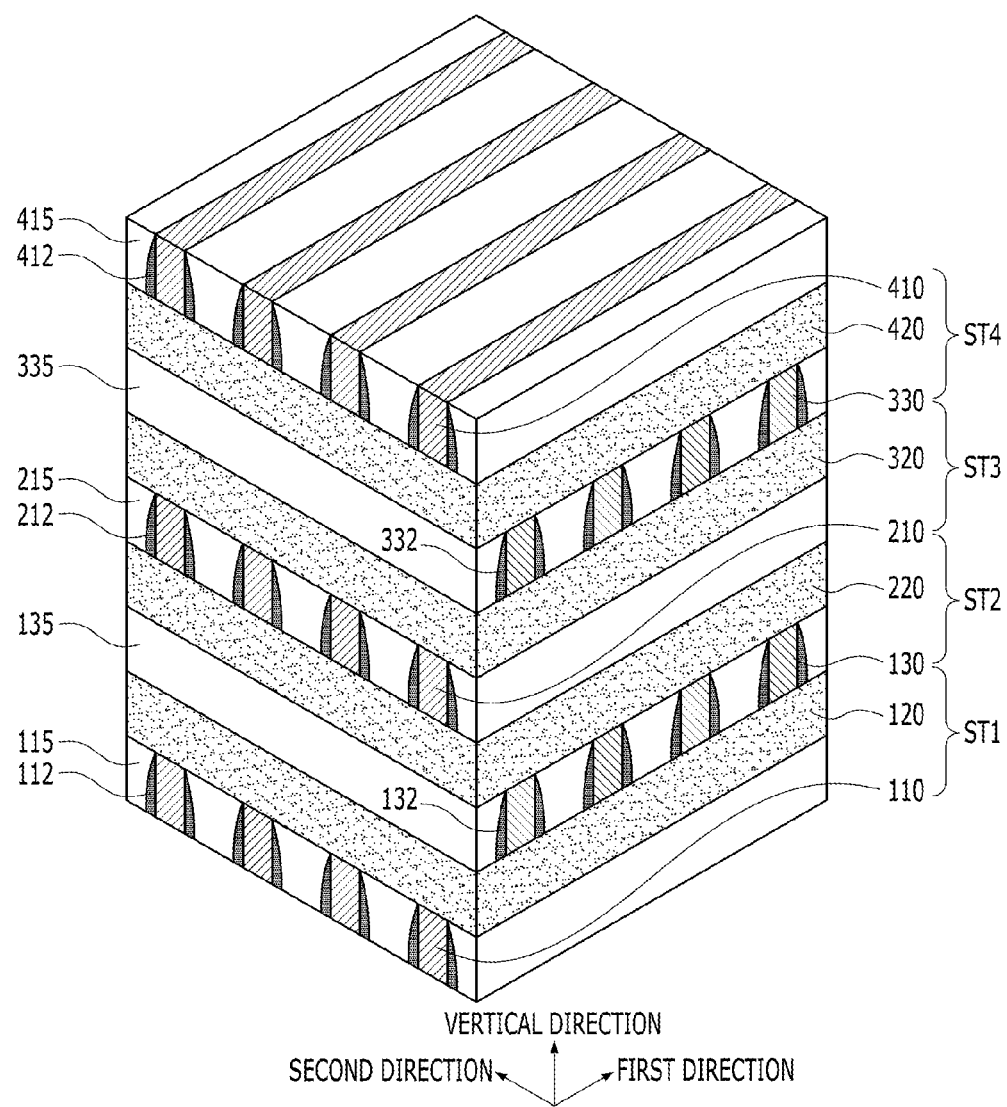
FIG. 8 illustrates an intermediate process of a method for fabricating a semiconductor device in accordance with an embodiment of the present disclosure.

Since the first lines 110, 210, and 410 and second lines 130 and 330 may be damaged during the etch process, spacers may be formed on sidewalls of the first lines 110, 210, and 410 and second lines 130 and 330. Referring to FIG. 8, first spacers 112, 212, and 412 are formed on the sidewalls of the first lines 110, 210, and 410, respectively. The first spacers 112, 212, and 412 extend in the first direction, similarly to the first lines 110, 210 and 410.

Similarly, second spacers 132 and 332 are formed on the sidewalls of the second lines 130 and 330, respectively. The second spacers 132 and 332 extend in the second direction.

The first and second spacers 112, 132, 212, 332, and 412 may be formed of insulating layers. In an embodiment, each of the first and second spacers 112, 132, 212, 332, and 412 includes a nitride layer having an etch rate lower than those of the first insulating layers 115, 215, and 415, the second insulating layers 135 and 335, and the variable resistance layers 120, 220, 320, and 420.

In an embodiment of the present disclosure, the aforementioned holes H are formed in regions enclosed by the first lines 110, 210, and 410 and the first spacers 112, 212, and 412 as well as the second lines 130 and 330 and the second spacers 132 and 332.

When masks to form the holes H are misaligned or a self-aligned etch process is performed in the presence of the first and second spacers 112, 132, 212, 332, and 412, since the first and second spacers 112, 132, 212, 332, and 412 function as an etch barrier, to substantially prevent damage to the first and second lines 110, 130, 210, 330, and 410, the alignment of the holes H may be more accurately controlled.

The above and other memory circuits or semiconductor devices based on the disclosed technology can be used in a range of devices or systems. FIGS. 9-13 provide some examples of devices or systems that can implement a memory circuit in accordance with an embodiment disclosed herein.

Figure 9:
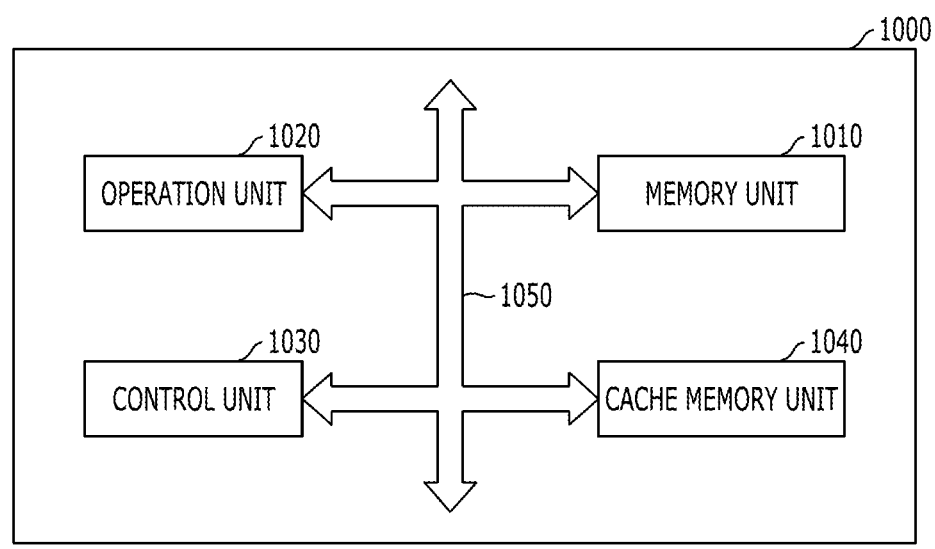
FIG. 9 illustrates a microprocessor implementing memory circuitry based on the disclosed technology.

FIG. 9 illustrates a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with embodiments. For example, the memory unit 1010 may include one or more first planes and one or more second planes which are disposed over a substrate and alternately stacked in a vertical direction to the substrate, where each of the first planes includes a plurality of first lines which are extended in a first direction parallel to the substrate and each of the second planes includes a plurality of second lines which are extended in a second direction parallel to the substrate and intersecting with the first direction; a plurality of variable resistance patterns which are interposed between the first planes and the second planes and have shapes of islands at cross points between the first lines and the second lines; and an air-gap which is disposed between the variable resistance patterns which are at same heights in the vertical direction. Through this, an integration degree of the memory unit 1010 may be increased and data storage characteristics of the memory unit 1010 may be improved. As a consequence, a size of the microprocessor 1000 may be reduced and performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
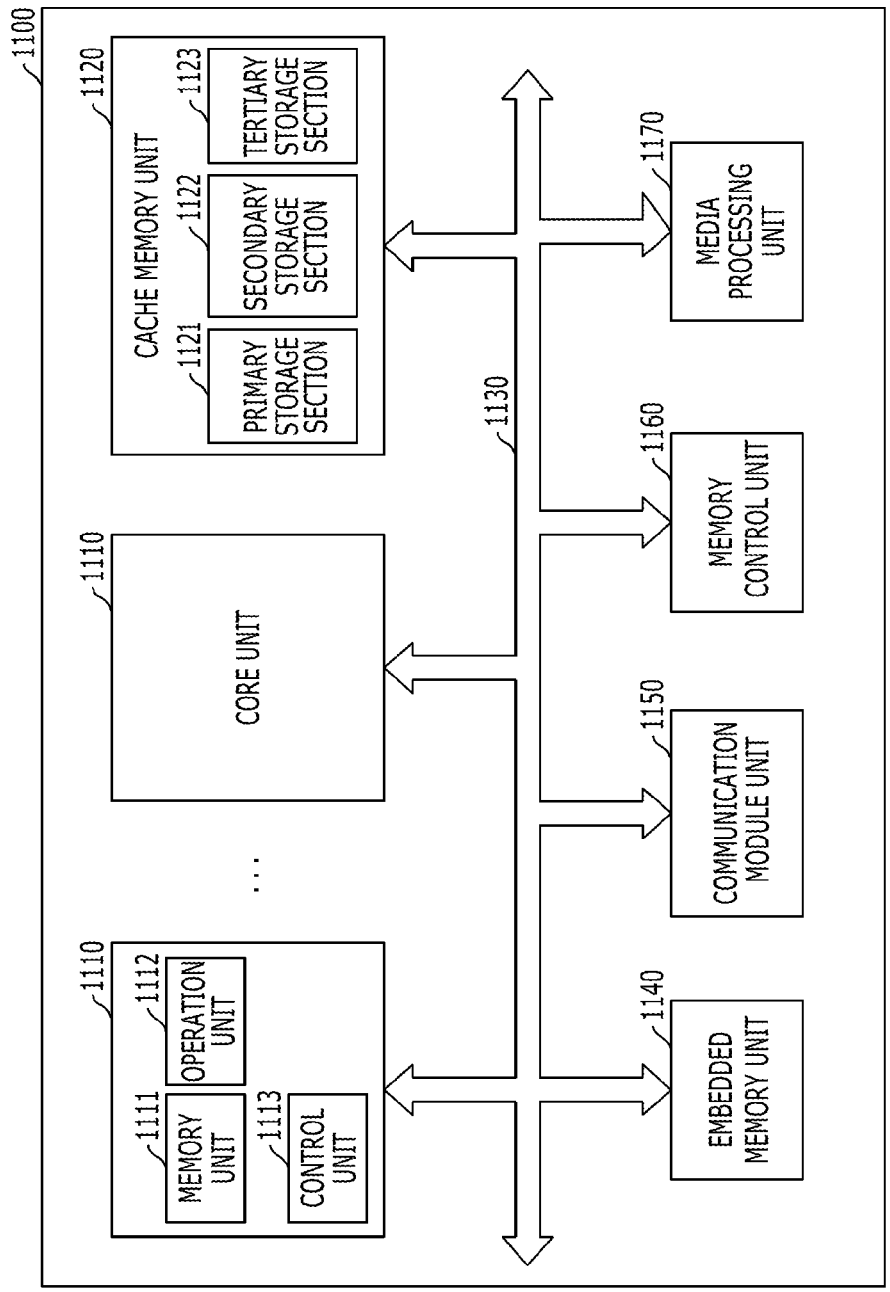
FIG. 10 illustrates a processor implementing memory circuitry based on the disclosed technology.

FIG. 10 illustrates a processor implementing memory circuitry based on the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this embodiment is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include one or more first planes and one or more second planes which are disposed over a substrate and alternately stacked in a vertical direction to the substrate, where each of the first planes includes a plurality of first lines which are extended in a first direction parallel to the substrate and each of the second planes includes a plurality of second lines which are extended in a second direction parallel to the substrate and intersecting with the first direction; a plurality of variable resistance patterns which are interposed between the first planes and the second planes and have shapes of islands at cross points between the first lines and the second lines; and an air-gap which is disposed between the variable resistance patterns which are at same heights in the vertical direction. Through this, an integration degree of the cache memory unit 1120 may be increased and data storage characteristics of the cache memory unit 1120 may be improved. As a consequence, a size of the processor 1100 may be reduced and performance characteristics of the processor 1100 may be improved.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another embodiment, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
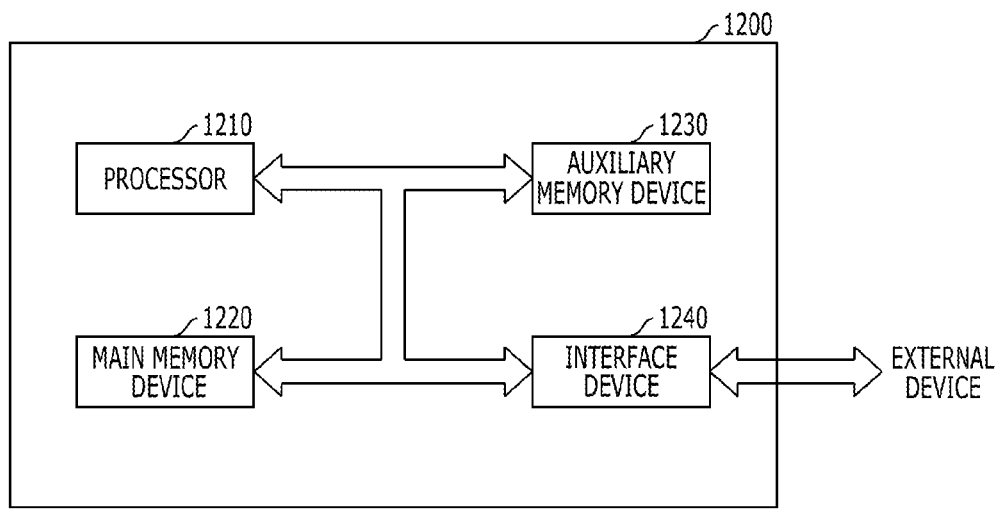
FIG. 11 illustrates a system implementing memory circuitry based on the disclosed technology.

FIG. 11 illustrates a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments. For example, the main memory device 1220 may include one or more first planes and one or more second planes which are disposed over a substrate and alternately stacked in a vertical direction to the substrate, where each of the first planes includes a plurality of first lines which are extended in a first direction parallel to the substrate and each of the second planes includes a plurality of second lines which are extended in a second direction parallel to the substrate and intersecting with the first direction; a plurality of variable resistance patterns which are interposed between the first planes and the second planes and have shapes of islands at cross points between the first lines and the second lines; and an air-gap which is disposed between the variable resistance patterns which are at same heights in the vertical direction. Through this, an integration degree of the main memory device 1220 may be increased and data storage characteristics of the main memory device 1220 may be improved. As a consequence, a size of the system 1200 may be reduced and performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the embodiments, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the embodiments. For example, the auxiliary memory device 1230 may include one or more first planes and one or more second planes which are disposed over a substrate and alternately stacked in a vertical direction to the substrate, where each of the first planes includes a plurality of first lines which are extended in a first direction parallel to the substrate and each of the second planes includes a plurality of second lines which are extended in a second direction parallel to the substrate and intersecting with the first direction; a plurality of variable resistance patterns which are interposed between the first planes and the second planes and have shapes of islands at cross points between the first lines and the second lines; and an air-gap which is disposed between the variable resistance patterns which are at same heights in the vertical direction. Through this, an integration degree of the auxiliary memory device 1230 may be increased and data storage characteristics of the auxiliary memory device 1230 may be improved. As a consequence, a size of the system 1200 may be reduced and performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the embodiments, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
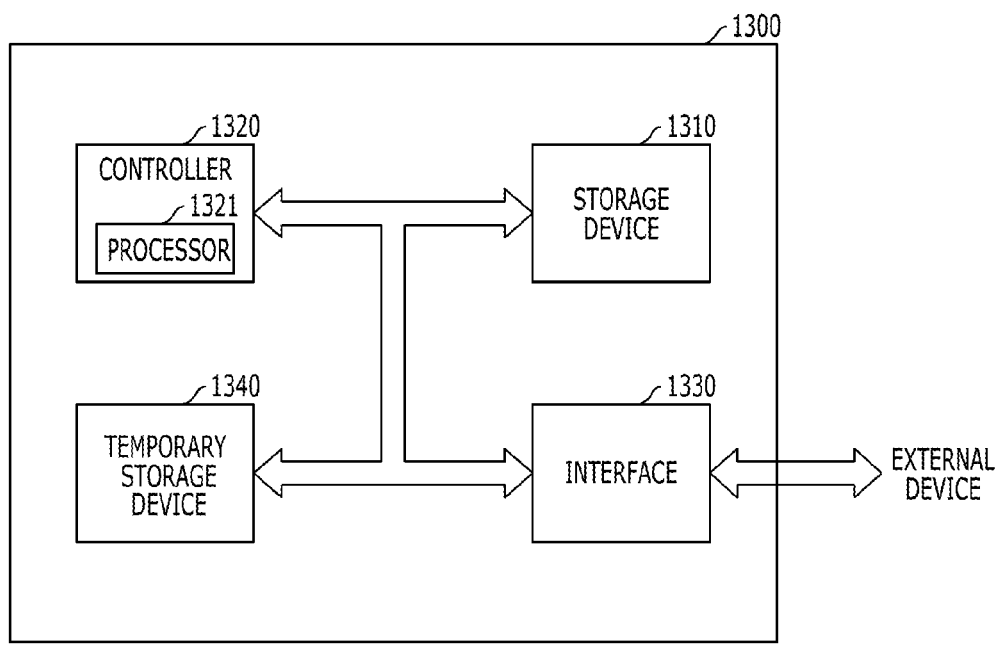
FIG. 12 illustrates a data storage system implementing memory circuitry based on the disclosed technology.

FIG. 12 illustrates a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. The temporary storage device 1340 may include one or more first planes and one or more second planes which are disposed over a substrate and alternately stacked in a vertical direction to the substrate, where each of the first planes includes a plurality of first lines which are extended in a first direction parallel to the substrate and each of the second planes includes a plurality of second lines which are extended in a second direction parallel to the substrate and intersecting with the first direction; a plurality of variable resistance patterns which are interposed between the first planes and the second planes and have shapes of islands at cross points between the first lines and the second lines; and an air-gap which is disposed between the variable resistance patterns which are at same heights in the vertical direction. Through this, an integration degree of the temporary storage device 1340 may be increased and data storage characteristics of the temporary storage device 1340 may be improved. As a consequence, a size of the data storage system 1300 may be reduced and performance characteristics of the data storage system 1300 may be improved.

Figure 13:
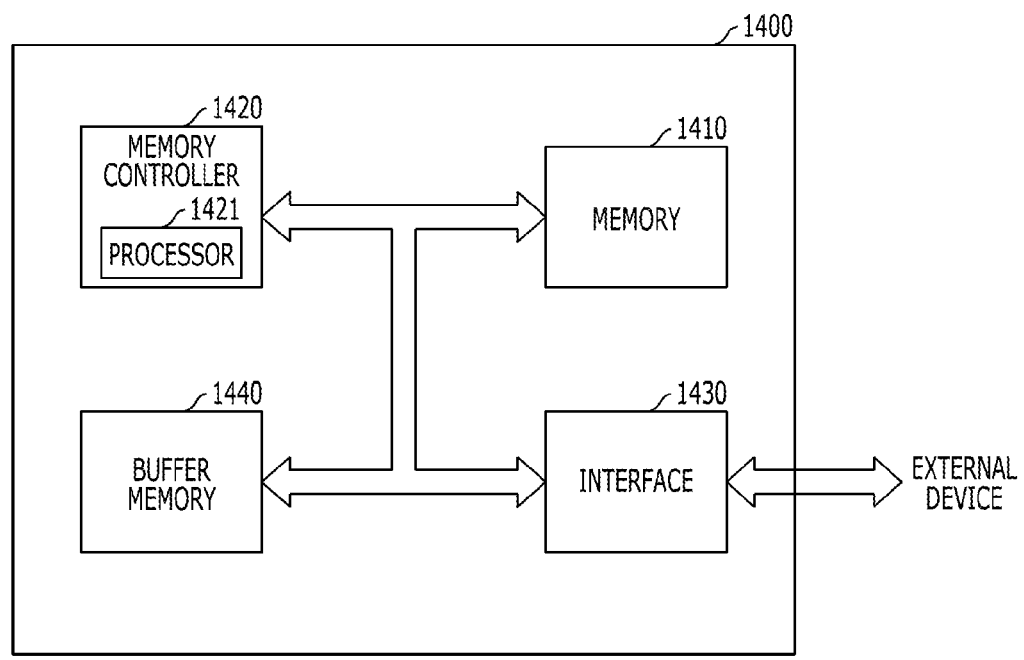
FIG. 13 illustrates a memory system implementing memory circuitry based on the disclosed technology.

FIG. 13 illustrates a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the embodiments. For example, the memory 1410 may include one or more first planes and one or more second planes which are disposed over a substrate and alternately stacked in a vertical direction to the substrate, where each of the first planes includes a plurality of first lines which are extended in a first direction parallel to the substrate and each of the second planes includes a plurality of second lines which are extended in a second direction parallel to the substrate and intersecting with the first direction; a plurality of variable resistance patterns which are interposed between the first planes and the second planes and have shapes of islands at cross points between the first lines and the second lines; and an air-gap which is disposed between the variable resistance patterns which are at same heights in the vertical direction. Through this, an integration degree of the memory 1410 may be increased and data storage characteristics of the memory 1410 may be improved. As a consequence, a size of the memory system 1400 may be reduced and performance characteristics of the memory system 1400 may be improved.

Also, the memory 1410 according to this embodiment may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this embodiment may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the embodiments. The buffer memory 1440 may include one or more first planes and one or more second planes which are disposed over a substrate and alternately stacked in a vertical direction to the substrate, where each of the first planes includes a plurality of first lines which are extended in a first direction parallel to the substrate and each of the second planes includes a plurality of second lines which are extended in a second direction parallel to the substrate and intersecting with the first direction; a plurality of variable resistance patterns which are interposed between the first planes and the second planes and have shapes of islands at cross points between the first lines and the second lines; and an air-gap which is disposed between the variable resistance patterns which are at same heights in the vertical direction. Through this, an integration degree of the buffer memory 1440 may be increased and data storage characteristics of the buffer memory 1440 may be improved. As a consequence, a size of the memory system 1400 may be reduced and performance characteristics of the memory system 1400 may be improved.

Moreover, the buffer memory 1440 according to this embodiment may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the embodiments, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 9-13 based on a memory device in accordance with an embodiment disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

An electronic device and a method for fabricating the same in accordance with embodiments of the present disclosure provide benefits including high integration, a decrease in a process's level of difficulty are possible, and increased reliability of a data storage characteristic.

While this present document contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few embodiment and examples are described. Other embodiments, enhancements and variations can be made based on what is described and illustrated in this disclosure.

What is claimed is:

1. An electronic device comprising a semiconductor memory unit, the semiconductor memory unit comprising:
   one or more first planes and one or more second planes, the first and second planes being alternately stacked in a vertical direction over the substrate, each of the first planes including a plurality of first lines extending in a first horizontal direction, each of the second planes including a plurality of second lines extending in a second horizontal direction, the second horizontal direction intersecting with the first horizontal direction;
   a plurality of variable resistance patterns interposed between each of the first planes and a corresponding one of the second planes, each of the variable resistance patterns being disposed at a cross point between a first line and a corresponding second line; and
   an air-gap disposed between neighboring variable resistance patterns that are at substantially the same level in the vertical direction,
   wherein the air-gap extends in the vertical direction to penetrate through the first and second planes in a region enclosed by two neighboring first lines and corresponding two neighboring second lines.

2. The electronic device according to claim 1, further comprising an insulating pattern surrounding the plurality of variable resistance patterns that are at substantially the same level in the vertical direction.

3. The electronic device according to claim 2, wherein the insulating pattern includes a mesh-like structure and surrounds the air-gap.

4. The electronic device according to claim 2, wherein the plurality of variable resistance patterns include a first metal oxide having oxygen vacancies, and the insulating pattern includes a second metal oxide, the second metal oxide having a greater oxygen content than the first metal oxide.

5. The electronic device according to claim 4, wherein the second metal oxide satisfies a stoichiometric ratio.

6. The electronic device according to claim 1, further comprising a plurality of insulating patterns which have an island shape, each of the plurality of insulating patterns surrounding each of the variable resistance patterns,
   wherein the air-gap includes a mesh-like structure and surrounds the plurality of insulating patterns.

7. The electronic device according to claim 1, wherein the air-gap includes a mesh-like structure and surrounds the variable resistance patterns.

8. The electronic device according to claim 1, wherein each of the plurality of variable resistance patterns has a tetragon shape including four curved line segments such that two diagonals of said each of the plurality of variable resistance patterns are substantially parallel to the first horizontal direction and the second horizontal direction, respectively.

9. The electronic device according to claim 1, further comprising:
   first spacers disposed on both sidewalls of each of the plurality of first lines; and
   second spacers disposed on both sidewalls of each of the plurality of second lines,
   wherein the air-gap is disposed between neighboring first spacers and between neighboring second spacers.

10. The electronic device according to claim 9, further comprising:
    a first insulating pattern which is disposed in a space between two neighboring first lines in the same plane; and
    a second insulating pattern which is disposed in a space between two neighboring second lines in the same plane,
    wherein the air-gap penetrates through the first and second insulating patterns.

11. The electronic device according to claim 10, wherein the first and second spacers include a material having an etch rate lower than that of the first and second insulating patterns and the variable resistance patterns.

12. The electronic device according to claim 1, further comprising:
    a first insulating pattern disposed in a space between two neighboring first lines in the same plane; and
    a second insulating pattern disposed in a space between two neighboring second lines in the same plane,
    wherein the air-gap penetrates through the first and second insulating patterns.

13. The electronic device according to claim 1, further comprising a microprocessor which includes:
    a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

14. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

15. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

16. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

17. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

\* \* \* \* \*